(12) United States Patent
Landsecker et al.

(10) Patent No.: US 11,747,211 B2
(45) Date of Patent: Sep. 5, 2023

(54) SUPPLY UNIT FOR GENERATING ELECTRIC ENERGY, KITCHEN UTENSIL AS WELL AS KITCHEN SYSTEM

(71) Applicant: Vorwerk & Co. Interholding GmbH, Wuppertal (DE)

(72) Inventors: Kai Landsecker, Düsseldorf (DE); Matthias Stein, Mülheim an der Ruhr (DE); Felix Thies, Wuppertal (DE); Wenjie Yan, Düsseldorf (DE); Miron Sernecki, Hagen (DE)

(73) Assignee: Vorwerk & Co. Interholding GmbH, Wuppertal (DE)

( * ) Notice: Subject to any disclaimer, the term of this patent is extended or adjusted under 35 U.S.C. 154(b) by 320 days.

(21) Appl. No.: 17/153,109

(22) Filed: Jan. 20, 2021

(65) Prior Publication Data
US 2021/0223111 A1    Jul. 22, 2021

(30) Foreign Application Priority Data
Jan. 21, 2020 (EP) .................................... 20152983

(51) Int. Cl.
*G01K 1/16* (2006.01)
*G01K 1/024* (2021.01)
*H10N 10/10* (2023.01)

(52) U.S. Cl.
CPC ............. *G01K 1/024* (2013.01); *H10N 10/10* (2023.02); *G01K 1/16* (2013.01); *G01K 2207/06* (2013.01); *G01K 2215/00* (2013.01)

(58) Field of Classification Search
CPC ........ G01N 33/12; G01N 27/041; A23L 5/15; A23L 13/00; A23B 4/044; G01G 23/36; A23Y 2002/00
See application file for complete search history.

(56) References Cited

U.S. PATENT DOCUMENTS 4,727,799 A * 3/1988 Ohshima .............. A47J 37/085
                                                       219/710
8,920,025 B2 * 12/2014 Andreatti .............. G01K 1/028
                                                       374/149
(Continued)

FOREIGN PATENT DOCUMENTS

CN       205560866 U  *  9/2016
CN       107543615 A  *  1/2018
(Continued)

OTHER PUBLICATIONS

Office Action for European Application No. 20152983.1 dated Jul. 2, 2020, with its English translation, 8 pages.

*Primary Examiner* — Gail Kaplan Verbitsky
(74) *Attorney, Agent, or Firm* — Rudy J. Ng; Bret E. Field; Bozicevic, Field & Francis LLP

(57) ABSTRACT

The invention relates to a supply unit (10) for generating electric energy for an electric function during an operation of a functional element (6) of a kitchen utensil (5) which can be arranged in a first temperature region (201), comprising a first temperature section (11) for an arrangement in the first temperature region (201), a second temperature section (12) for an arrangement in a second temperature region (202) comprising a temperature difference (200) with respect to the first temperature region (201). Furthermore, the invention relates to a kitchen utensil (5), as well as a kitchen system (1).

15 Claims, 3 Drawing Sheets

(56) References Cited

U.S. PATENT DOCUMENTS

Figure 1:
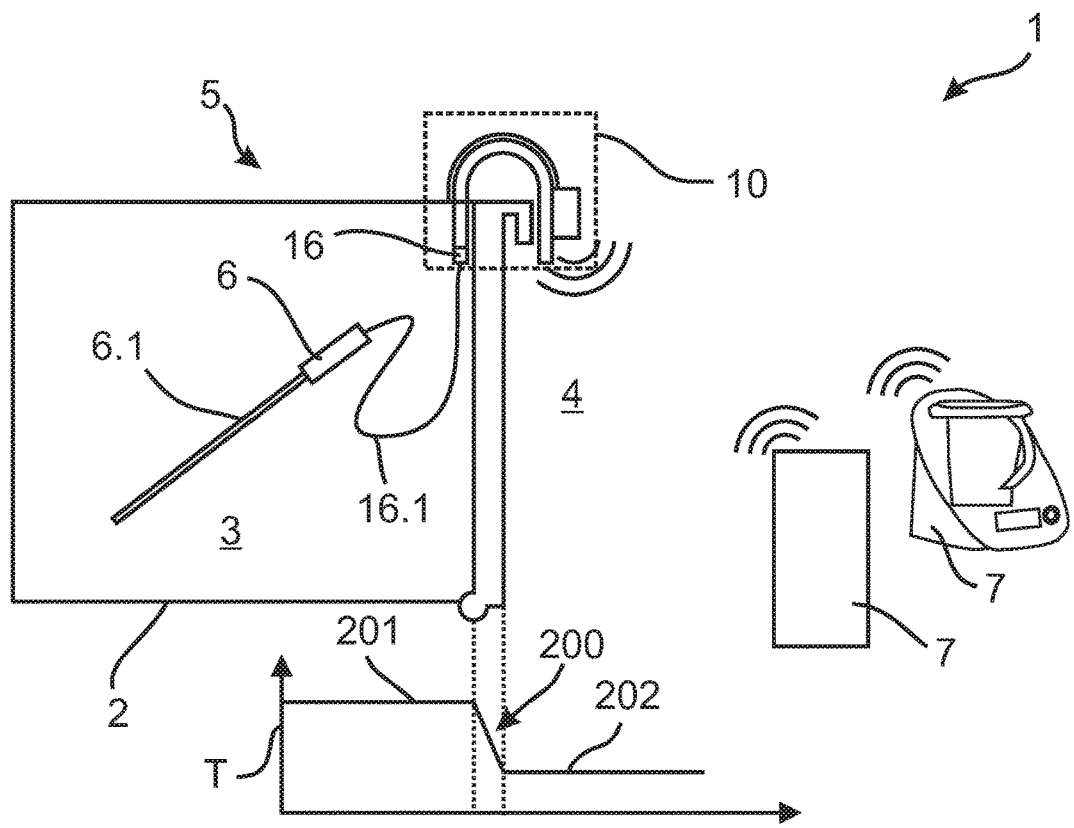

| | | | |
|---|---|---|---|
| 10,444,080 B2 * | 10/2019 | Brown | G01K 7/22 |
| 2006/0016446 A1 * | 1/2006 | Hu | F24C 3/008 |
| | | | 126/41 R |
| 2009/0324785 A1 * | 12/2009 | Ceravalls Pujol | G01K 1/14 |
| | | | 99/325 |
| 2013/0128919 A1 * | 5/2013 | Austen | G01K 1/026 |
| | | | 374/E3.001 |
| 2015/0059469 A1 | 3/2015 | Batti et al. | |
| 2016/0095469 A1 * | 4/2016 | Gregory | F24C 15/166 |
| | | | 99/421 H |
| 2016/0377490 A1 * | 12/2016 | Nivala | G01K 7/42 |
| | | | 374/155 |
| 2017/0138798 A1 * | 5/2017 | Brown | G01K 1/14 |
| 2017/0301849 A1 * | 10/2017 | Himmer | H01L 35/32 |
| 2018/0261751 A1 * | 9/2018 | Angermann | H01L 35/34 |
| 2018/0353003 A1 | 12/2018 | Sabata et al. | |
| 2020/0101481 A1 * | 4/2020 | Mohagheghi | G05B 13/024 |
| 2021/0196078 A1 * | 7/2021 | Colston | F24C 15/14 |

FOREIGN PATENT DOCUMENTS

| | | | | |
|---|---|---|---|---|
| CN | 107664534 A | * | 2/2018 | G01J 5/04 |
| CN | 207050021 U | * | 2/2018 | |
| CN | 108151085 A | * | 6/2018 | F24C 3/126 |
| CN | 207460034 U | * | 6/2018 | |
| CN | 212204624 U | * | 12/2020 | |
| CN | 112038476 B | * | 1/2023 | B81C 1/00047 |
| DE | 102021110087 A1 | * | 10/2022 | |
| FR | 2781931 A1 | * | 2/2000 | G01J 5/12 |
| JP | H6313554 A | * | 6/1994 | |
| JP | H0763343 A | * | 7/1995 | |
| JP | 2003322344 A | * | 11/2003 | |
| JP | 3712809 B2 | * | 11/2005 | |
| KR | 101444806 B1 | * | 9/2014 | |
| KR | 20200122839 A | * | 10/2020 | |
| PL | 433545 A1 | * | 10/2021 | |
| WO | WO-2019038172 A1 | * | 2/2019 | A47J 31/04 |
| WO | WO-2021003140 A1 | * | 1/2021 | A61B 5/015 |

* cited by examiner

SUPPLY UNIT FOR GENERATING ELECTRIC ENERGY, KITCHEN UTENSIL AS WELL AS KITCHEN SYSTEM

The invention relates to a supply unit for generating electrical energy, a kitchen utensil and a kitchen system.

When preparing and cooking food, different kitchen apparatuses are used with special temperature zones that differ from the room temperature. In a refrigerator, for example, a cold temperature is generated to store food for a longer time. In an oven, a high temperature is generated to bake food. Kitchen utensils that are to be used in these special temperature zones are therefore usually fully designed for these temperature zones.

An electric energy supply within the temperature zones is often not possible or complex to implement if any energy storage devices, such as batteries, are protected from the temperature influences. Furthermore, such temperature zones are often also shielded from radio signals by a cover of the kitchen apparatus, so that, for example, a check of temperature values is usually carried out via an analog display that can be viewed through a viewing window, such as an oven window.

It is an object of the present invention to at least partially overcome the foregoing disadvantages known from the prior art. In particular, it is an object of the present invention to enable an electric function of a kitchen utensil while the kitchen utensil is at least partially in a temperature region which differs from the ambient temperature.

The foregoing object is solved by a supply unit with the features of claim 1, a kitchen utensil with the features of claim 12, and a kitchen system with the features of claim 15. Further features and details of the invention result from the respective dependent claims, the description and the figures. In this context, features and details described in connection with the supply unit according to the invention also apply in connection with the kitchen utensil according to the invention and/or the kitchen system according to the invention, and vice versa in each case, so that reference is or can always be made mutually with respect to the disclosure concerning the individual aspects of the invention.

According to a first aspect of the invention, there is provided a supply unit for generating electric energy for a function during an operation of a functional element of a kitchen utensil which can be arranged in a first temperature region. The supply unit comprises a first temperature section for an arrangement in the first temperature region, and a second temperature section for an arrangement in a second temperature region. The second temperature region comprises a temperature difference with respect to the first temperature region. Further, the supply unit comprises a providing means for providing electric energy for the function during operation of the functional element. The providing means comprises a conversion element for converting thermal energy into electric energy depending on the temperature difference.

The supply unit can thus also be referred to as an energy providing unit or energy supply unit. The electric function may comprise a function of the functional element itself, such as a measurement function, within the first temperature region. In particular, the electric function may enable the operation of the functional element and may comprise, for example, an energy supply of the functional element. However, it is also conceivable that the electric function comprises a data processing of data of the functional element and/or a communication between the functional element and a user or another electric component. The kitchen utensil may be, for example, a sensor or a measuring instrument. Additionally or alternatively, the kitchen utensil may further comprise one or more other functions for preparing food. The first temperature zone may comprise a heat zone or a cold zone. For example, it is conceivable that the supply unit can be arranged on an oven, a pot, a refrigerator, or an electric food processor for at least partially automated preparation of food to enable the electric function during operation of the functional element.

The first and second temperature section of the supply unit may be indirectly or directly connected to each other. Preferably, both temperature sections comprise a thermally conductive material, such as a metal, in order to be able to at least partially supply different temperatures in the first and second temperature region to the conversion element. In particular, the conversion element is arranged to be at least partially exposed to the temperature difference between the first and second temperature region. The temperature difference can be used by the conversion element to generate electric energy and provide it for the function.

This means that the supply unit can be used for energy management of the kitchen utensil while the functional element is in the first temperature region. Thus, it is not necessary to protect an energy storage device against the temperature conditions in the first temperature region. Furthermore, a connection between the first temperature region and the second temperature region can be established by the supply unit.

Furthermore, in a supply unit according to the invention, it may advantageously be provided that the conversion element comprises an electro-thermal converter. The electro-thermal converter may be a semiconductor component, preferably a Peltier element. In particular, the electro-thermal converter may also be referred to as a thermoelectric generator or thermoelectric converter. Preferably, the electric energy can be generated by the electro-thermal converter by utilizing the Seebeck effect. In this regard, an electric voltage and/or an electric current may be inducible in the conversion element depending on the temperature difference between the first and second temperature region and/or between the first and second temperature section. The electric energy may be provided by the providing means for the electric function during operation of the functional element. For example, the conversion unit may be directly or indirectly connected or connectable to an electric component.

Furthermore, in a supply unit according to the invention, it can advantageously be provided that the first and second temperature sections are connected by a thermally conductive bridge element, in particular wherein the bridge element comprises an insulation layer for thermal insulation from an environment. The bridge element may comprise a thermally conductive material to enable heat exchange between the first and second temperature section. In particular, the insulation layer comprises a low thermal conductivity material. For example, the insulation layer may comprise a plastic. The insulation layer may prevent a user who touches the supply unit from being exposed to a forwarded temperature of the first temperature region. Furthermore, this can reduce or prevent temperature loss between the first and second temperature region. As a result, the highest possible portion of the temperature difference can reach the conversion element and, in particular, can be usable for generating the electric energy. Preferably, the bridge element may comprise a flat extension and/or can be curved to be clampable in a flap of the kitchen apparatus, such as an oven door, a refrigerator door or the like. For example, the bridge element may comprise a sheet body. Preferably, the supply unit may be fixed to the kitchen apparatus by the bridge element.

Furthermore, in a supply unit according to the invention, it is conceivable that the bridge element is designed for an arrangement in a door region of a kitchen apparatus, so that the first temperature region can be arranged in an interior of the kitchen apparatus and the second temperature region can be arranged in an exterior, in particular wherein the bridge element and the first and second temperature sections form a U-shaped fixing section for fixing the supply unit to the kitchen apparatus. The interior may be, for example, a baking space of an oven, a cooking space of a pot or a container of a food processor, or a cooling region of a refrigerator. The exterior can preferably comprise an ambient temperature, in particular room temperature. Thus, an advantageous temperature difference can be created for the generation of electric energy. Furthermore, the supply unit can thus achieve an actually inaccessible first temperature region of the kitchen apparatus accessible for the electric function even during operation. By means of the u-shaped fixing section, the supply unit can be hooked into a flap of the kitchen apparatus. Thereby, a detachable fixing possibility may be created resulting from a geometrical shape of the supply unit.

Furthermore, it is conceivable in a supply unit according to the invention that the conversion element is arranged at the first temperature section, at the second temperature section and/or at the bridge element. By the arrangement at the bridge element, a supply of temperature from the first and second temperature section to the conversion element can occur from two sides of the conversion element. By the arrangement at the first or second temperature section, the conversion element can be exposed to the first or second temperature region itself and can experience a supply of temperature from the respective other temperature region via the first or second temperature region. An arrangement at the second temperature region and/or at the bridge element further has the advantage that the conversion element is not completely exposed to the first temperature region.

Furthermore, in a supply unit according to the invention, it can advantageously be provided that the providing means comprises an additional energy source for providing electric energy, preferably for the electric function and/or a further function, in particular wherein the providing means comprises a switching element for interconnecting the additional energy source for providing electric energy. The additional energy source may comprise an energy storage device, e.g. in the form of a battery or an accumulator. However, it is also conceivable that the additional energy source comprises at least one photovoltaic module, at least one electroactive elastomer, and/or at least one piezoelectric element to generate the electric energy. The additional energy source may enable the conversion element to be assisted in providing electric energy. However, it is also conceivable that the conversion element can be switched off, in particular by the switching element, so that the electric energy supply for the function for the kitchen utensil and/or a further electric function is provided entirely by the energy source. The switching element may comprise an electric switch, in particular in the form of a relay or a semiconductor component.

It is further conceivable in a supply unit according to the invention that an electronic unit is provided for data and/or signal processing for the function of the kitchen utensil, in particular wherein a printed circuit board of the electronic unit is arranged at the second temperature section. The electronic unit may comprise at least one electronic component for the data and/or signal processing. For example, it may be provided that analogue measurement signals of the functional element can be digitized by the electronic unit. In particular, the providing means may be designed to provide the electric energy for the electronic unit. Thus, the data and/or signal processing can form the electric function for which the electric energy can be provided by the providing means. The arrangement of the printed circuit board at the second temperature section has the advantage that the printed circuit board is not exposed to the temperature in the first temperature region and thus can be designed for operation at room temperature. Complex protective measures against a temperature in the first temperature region can consequently be omitted.

Furthermore, in a supply unit according to the invention, it can advantageously be provided that the electronic unit comprises an evaluation module for evaluating measurement signals of the kitchen utensil, in particular of the functional element. In particular, measurement data of the functional element can be evaluated or pre-evaluated by the electronic unit. Due to the proximity of the electronic unit to the functional element, a signal path can be shortened so that transmission losses can be kept low. Furthermore, the supply unit can form a modular interface by the evaluation module, which can be coupled with different apparatuses to transmit measurement data. Furthermore, the kitchen utensil, in particular the supply unit, can comprise a display via which the processed measurement signals can be displayed to a user. Preferably, the evaluation module is arranged on the printed circuit board at the second temperature section to enable a temperature-protected arrangement of the evaluation unit. The evaluation unit can be connected to the providing means in order to be energized by the providing means.

Furthermore, in a supply unit according to the invention, it is conceivable that the providing means comprises a connection means for a connection for current transmission to the functional element and/or for data communication with the functional element. In particular, the connection for current transmission may be a, preferably detachable, electric connection. The connection means may comprise electric contacts, preferably with a plug or a socket for detachable coupling with the functional element. However, it is further conceivable that the connection means comprises a cable that permanently electrically connects the functional element to the providing means. By the connection means, the functional element can be supplied in the first temperature region by the electric energy provided by the providing means. Furthermore, in particular cable-based, data communication can be enabled by the electric connection means. For this purpose, the electric connection means can comprise several connection contacts for separate current and signal transmission.

Preferably, in a supply unit according to the invention, it can be provided that the connection means comprises an internal communication module for a wireless data communication with the functional element of the kitchen utensil and/or that the electronic unit comprises an external communication module for a wireless data communication with an end device. By the internal communication module and/or the external communication module may be respectively understood, for example, a WLAN module, a Bluetooth module, an NFC module and/or a mobile radio module. Due to the wireless connection, a cable connection of the supply unit to the end device and/or to the functional element may not be necessary. The end device may be understood to mean, for example, a mobile end device, such as a tablet or a smartphone, of a user, a kitchen machine or any other electronic apparatus designed to receive data. It may further be provided that the internal communication module of the connection means is adapted to transmit electric energy via the wireless data connection. For example, an RFID chip of the functional element may be energizable by the wireless data connection. As a result, a cable connection may not be necessary in the first temperature region. In particular, the internal communication module and the external communication module may each enable data reception and/or data transmission. The internal communication module and the external communication module may further comprise coil antennas for data communication.

It is further conceivable in a supply unit according to the invention that the bridge element comprises a signal bridge for forwarding electric signals between the first and second temperature region. Advantageously, the signal bridge may comprise an electrically conductive material for transporting the electric signals between the first and second temperature region. In this regard, the signal bridge may be connected to the internal communication module and the external communication module for data communication. For example, the signal bridge may comprise a cable or an electrically conductive sheet. Furthermore, it is conceivable that the signal bridge extends in a layered manner along the bridge element. Thus, the signal bridge may provide an advantageous possibility to transport electric signals into the first temperature region. For example, it is conceivable that the first temperature region is located in a Faraday cage which is shielded from electric signals. This may be the case, for example, if the first temperature region is formed by an interior of an oven. It may therefore be possible to overcome a shielding of the kitchen apparatus by means of the signal bridge. Alternatively, it is conceivable that the communication signals can be transported optically through a viewing pane of the kitchen apparatus or at least partially by cable via an electric energy supply of an illumination of the interior, such as an oven illumination, in order to overcome the shielding.

According to a further aspect of the invention, a kitchen utensil is provided. The kitchen utensil comprises a functional element for an arrangement in a first temperature region and a supply unit, in particular a supply unit according to the invention, for generating electric energy for a function during an operation of the functional element. The supply unit comprises a first temperature section for an arrangement in the first temperature region and a second temperature section for an arrangement in a second temperature region, which comprises a temperature difference with respect to the first temperature region. Further, the supply unit comprises a providing means for providing electric energy for the function during operation of the functional element. The providing means comprises a conversion element for converting thermal energy into electric energy depending on the temperature difference.

Thus, a kitchen utensil according to the invention comprises the same advantages as already described in detail with reference to a supply unit according to the invention. The functional element and the supply unit can form a structural unit or can be combined in a modular manner. In particular, the functional element and the supply unit can be structurally separate and can be brought into a data communication connection, for example, when the supply unit processes data of the functional element. Preferably, the supply unit can be connectable or permanently connected to the functional element in a wireless or wired manner. Thus, a connection in the first temperature region can be enabled by the kitchen utensil without exposing critical components to the temperature in the first temperature region.

Furthermore, in a kitchen utensil according to the invention, it can advantageously be provided that the functional element comprises a sensor for sensing process data during the use of the kitchen utensil and/or a kitchen apparatus, in particular wherein the sensor is a temperature sensor. Thus, the functional element may be, for example, a measurement sensor. For example, the sensor may be a thermistor for which electric energy may be provided by the providing means. In particular, the kitchen utensil may be a meat thermometer. The process data may be, for example, cooking data of food prepared in the first temperature region. However, it is further conceivable that the process data may be ambient data in the first temperature region. In particular, the process data may comprise temperature data and/or acoustic, optical and/or haptic data. For example, sounds or light spectra recorded by the functional element in the first temperature region may indicate wear of components of the kitchen apparatus or the kitchen utensil. Additionally or alternatively, the supply unit may comprise a sensor, in particular in the form of a temperature sensor.

It is further conceivable in a kitchen utensil according to the invention that the functional element and a connection means of the supply unit each comprise an internal communication module for a, in particular wireless, connection of the functional element to the supply unit or that the connection means comprises an electric conductor for connecting the functional element to the supply unit. The electric conductor may, for example, be a cable. If the functional element itself comprises an internal communication module, a radio connection of the supply unit and the functional element may be enabled. The radio connection means that a cable connection to the functional element is not necessary.

According to another aspect of the invention, a kitchen system is provided. The kitchen system comprises a kitchen apparatus with an interior which comprises a temperature difference with respect to an exterior. Further, the kitchen system comprises a kitchen utensil according to the invention which can be arranged partially in the interior and partially in the exterior.

Thus, a kitchen utensil according to the invention comprises the same advantages as already described in detail with reference to a supply unit and/or a kitchen utensil according to the invention. The kitchen apparatus may be, for example, an oven, a pot, a refrigerator, a freezer, a steamer or an electric food processor for at least partially automated preparation of food. The interior may be a temperature zone that is colder or warmer than a room temperature. The exterior may, for example, be an ambient temperature or room temperature. In particular, the interior of the kitchen apparatus may be electrically shielded. In this case, data communication of the exterior and the interior can be enabled via the supply unit.

Figure 2:
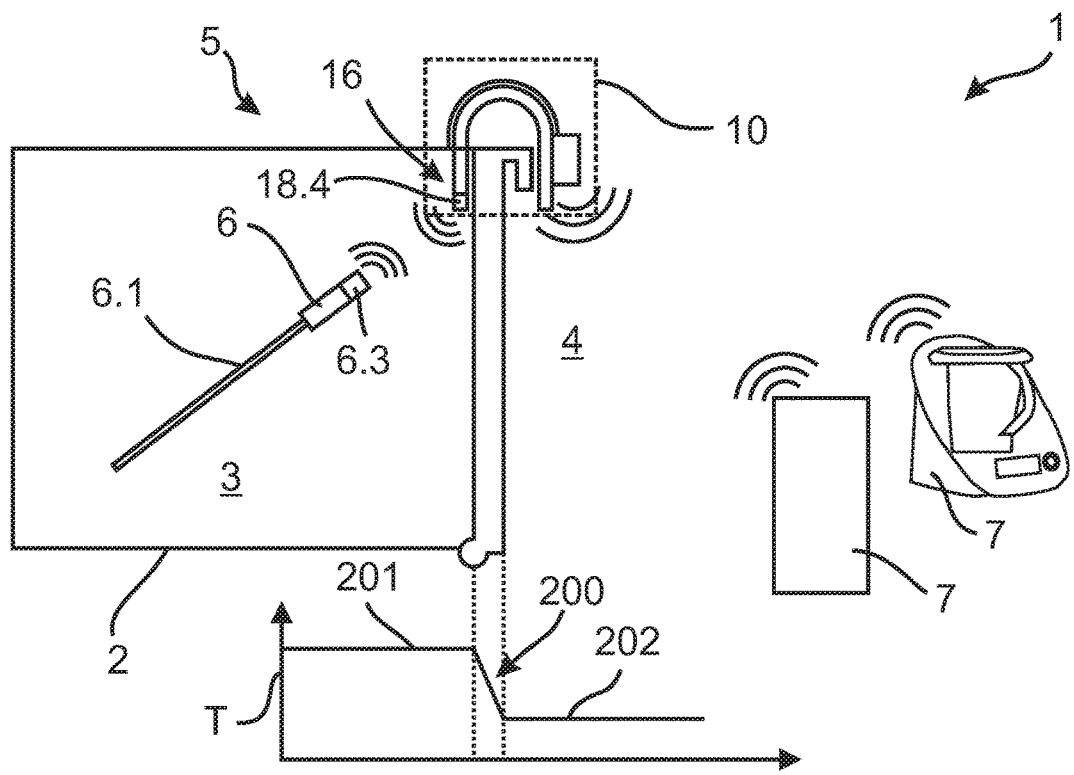
Figure 3:
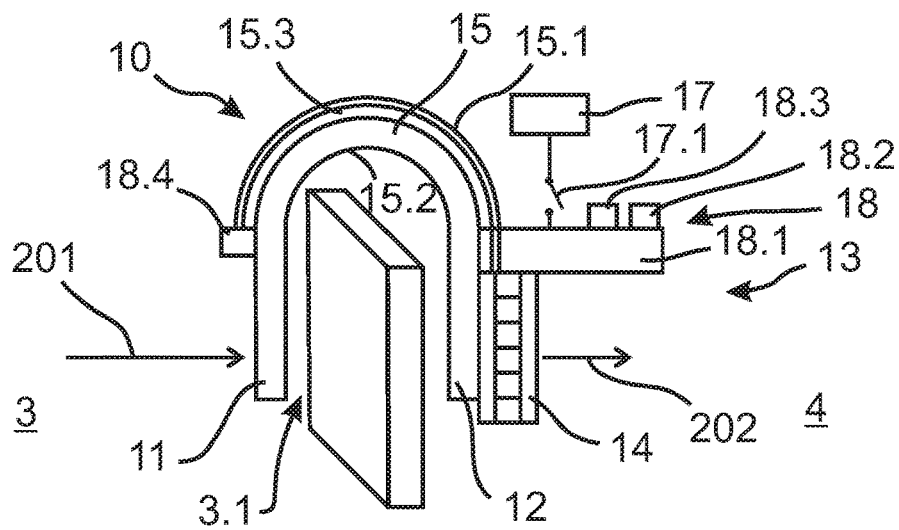
Figure 4:
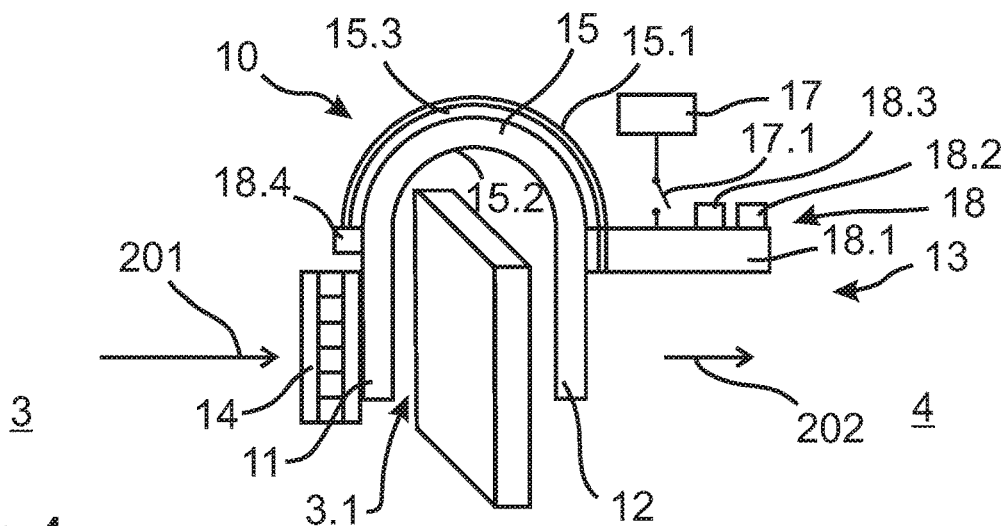
Figure 5:
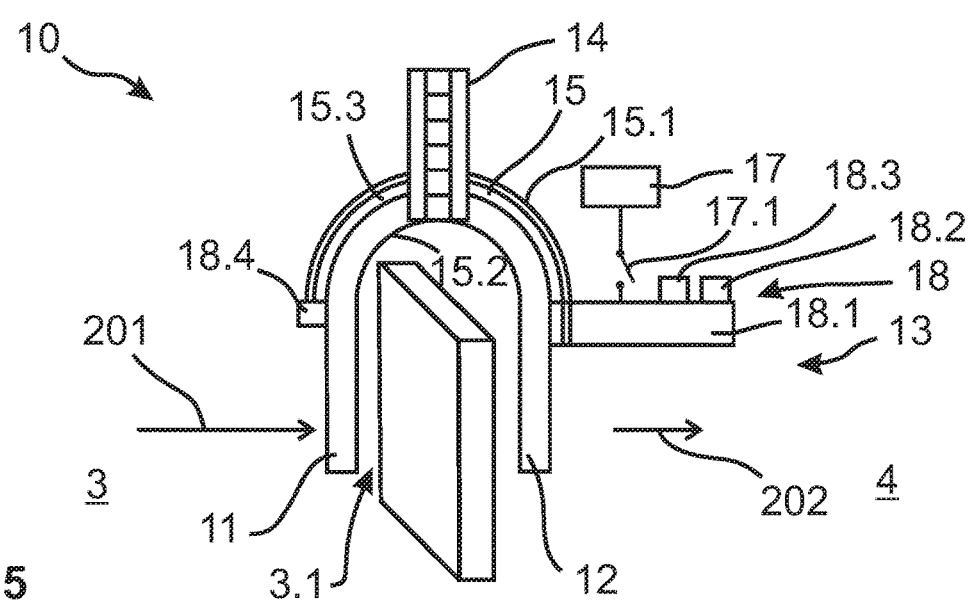
Figure 6:
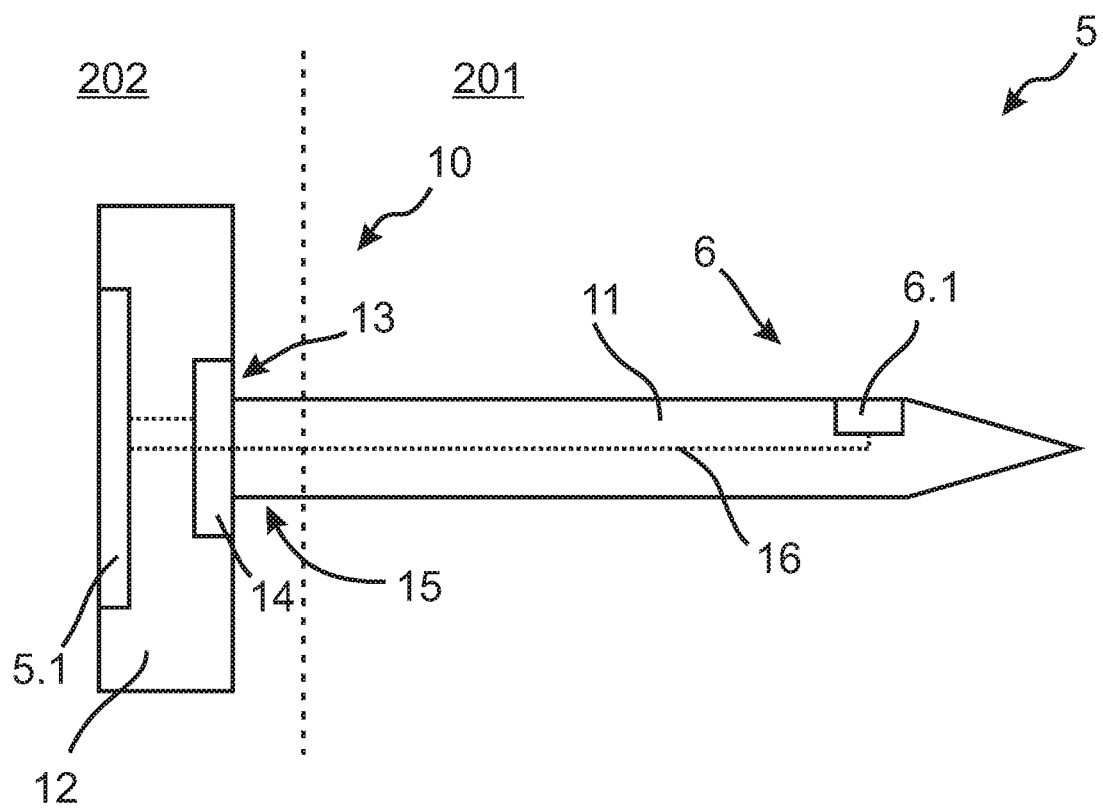

Further advantages, features and details of the invention will be apparent from the following description, in which embodiments of the invention are described in detail with reference to the figures. Thereby, the features mentioned in the claims and in the description may each be essential to the invention individually or in any combination. The figures schematically show:

FIGS. 1-2 a kitchen system according to the invention in different embodiments, FIGS. 3-5 a supply unit according to the invention in different embodiments, FIG. 6 a kitchen utensil according to the invention in a further embodiment.

In the following description of some embodiments of the invention, identical reference signs are used for the same technical features even in different embodiments.

FIG. 1 shows a kitchen system 1 according to the invention with a kitchen apparatus 2 and a kitchen utensil 5 according to the invention. The kitchen apparatus 2 may be, for example, an oven. The kitchen utensil 5 comprises a functional element 6 for an arrangement in a first temperature region 201 and a supply unit 10 for generating electric energy. The supply unit 10 thereby extends partially into an interior 3 and partially into an exterior 4 of the kitchen apparatus 2. In the interior 3 there is an increased temperature T compared to the exterior 4, as shown by the diagram illustrated in FIG. 1. A first temperature region 201 is formed by the interior 3 and a second temperature region 202 is formed by the exterior 4. The first and second temperature regions 201, 202 comprise a temperature difference 200 with respect to each other. Preferably, the exterior 4 is at room temperature. The exterior 4 is in particular an environment of the kitchen apparatus 2. However, it is also conceivable that the temperature T in the interior 3 is lower than in the exterior 4 if the kitchen apparatus 2 is, for example, a refrigerator. The functional element 6 is arranged in the first temperature region 201 and comprises a sensor 6.1, in particular in the form of a temperature sensor. The functional element 6 can thus be, for example, a measurement sensor for measuring the temperature in the interior 3. Furthermore, the functional element 6 is electrically connected to the supply unit via a connection means 16, in particular in the form of a detachable electric conductor 16.1 and a plug. Furthermore, the supply unit 10 is designed for wireless data communication with an end device 7 of a user. The end device 7 may be an electromotive kitchen machine or a smartphone. In particular, the supply unit 10 may be designed to communicate with different end devices 7. By the wireless data communication, sensor data of the sensor 6.1 of the functional element 6 can be provided to a user.

In addition or as an alternative to the wired connection, the supply unit 10 and the functional element 6 may each comprise an internal communication module 6.3, 18.4 for a current transmission from the supply unit 10 to the functional element 6 and/or for data communication of the supply unit 10 with a functional element 6, as shown in FIG. 2.

The supply unit 10 is shown in detail in FIG. 3. Here, the supply unit 10 comprises a first temperature section 11 for an arrangement in the first temperature region 201 and a second temperature section 12 for an arrangement in the second temperature region 202. Thus, the supply unit 10 is exposed to both temperature regions 201, 202. To connect the first and second temperature sections 11, 12, the supply unit 10 further comprises a bridge element 15. The bridge element 15 and the first and second temperature sections 11, 12 form a U-shaped fixing section 15.2 for fixing the supply unit 10 to the kitchen apparatus 2. This allows the supply unit 10 to be hung over a door region 3.1 of the kitchen apparatus 2, for example, and/or to be arranged in a door gap to provide the connection between the interior 3 and the exterior 4. Preferably, the bridge element 15 further comprises an insulation layer 15.1 for thermal insulation from an environment. Thereby, heat loss during heat transfer between the first and second temperature section 11, 12 can be reduced or prevented. Furthermore, a user can thereby be protected from excessive heat.

For providing electric energy for an electric function during an operation of the functional element 6, the supply unit 10 comprises a providing means 13. The providing means 13 comprises a conversion element 14 for converting thermal energy into electric energy depending on the temperature difference 200 between the first and second temperature region 201, 202 or the first and second temperature section 11, 12. The conversion element 14 is an electrothermal converter, in particular in the form of a Peltier element. In this case, heat is absorbed via the first temperature section 11 and conducted to the second temperature section 12 via the bridge element 15. As a result, the temperature difference 200 between the first and second temperature section 11, 12 is established at least partially at the conversion element 14. Due to the fact that the conversion element 14 is arranged at the second temperature section 12, the conversion element 14 is exposed to the temperature difference 200 at least partially or completely. The resulting thermal energy can be converted by the conversion element 14 into electric energy depending on the temperature difference 200. Thereby, an electric voltage and/or an electric current is induced in the providing means 13 by the conversion element 14 and provided for the function. In the illustrated embodiment according to FIG. 2, the function is the processing and/or forwarding of radio signals for wireless communication of the functional element 6 in the first temperature region 201 and an end device 7 of the user. In this context, the functional element 6 can be supplied with current via the wireless communication in order to enable, for example, a measurement function or a feedback function. However, it is also conceivable that the electric energy is provided only for a function of the functional element 6, such as the measurement function. Preferably, a permanent electric connection is provided between the supply unit 10 and the functional element 6, as shown in FIG. 1.

Furthermore, the supply unit 10 comprises an electronic unit 18 for data and/or signal processing for the function of the kitchen utensil 5. The electronic unit 18 comprises a printed circuit board 18.1, on which an evaluation module 18.2 for evaluating measurement signals of the functional element 6 of the kitchen utensil 5 is arranged. For example, the evaluation module 18.2 can be energized by the conversion element 14. Furthermore, the supply unit 10 comprises an external communication module 18.3 for wireless data communication with the end device 7 and an internal communication module 18.4 for wireless data communication with the functional element 6. Here, the internal communication module 18.4 for wireless data communication with the functional element 6 is arranged at the first temperature section 11. For example, the internal communication module 18.4 may be a coil antenna, in particular which is insensitive or less sensitive to the first temperature region 201. In particular, the printed circuit board 18.1 is arranged at the second temperature section 12 and thus not directly exposed to the first temperature region 201. For example, the printed circuit board 18.1 may be protected at the second temperature section 12 from thermal conduction from the first temperature section 11 to the second temperature section 12 by the insulation layer 15.1. To transmit signals from the first temperature section 11 to the second temperature section 12, the bridge element 15 comprises a signal bridge 15.3. By the signal bridge 15.3, electric signals can be exchanged between the first and second temperature region 201, 202. For example, an electric shielding of the interior 3 can be overcome by the signal bridge 15.3. Furthermore, by the signal bridge 15.3, the internal communication module 18.4 can be connected to the printed circuit board 18.1 and/or the conversion element 14 for wireless data communication with the functional element 6.

Preferably, the providing means 13 comprises an additional energy source 17 for providing electric energy. The additional energy source 17 can be, for example, a battery, an accumulator or the like. For this purpose, the providing means 13 further comprises an electric switching element 17.1 for interconnecting the additional energy source 17. If, for example, the temperature difference 200 is not sufficient to generate the required electric energy, the additional energy source 17 can be interconnected to the conversion element 14. However, it is also conceivable that the conversion element 14 can be electrically disconnected to enable electric energy to be provided entirely by the additional energy source 17.

FIGS. 4 and 5 also show further possible arrangements of the conversion element 14. For example, the conversion element 14 can be arranged at the first temperature section 11 as shown in FIG. 4, so that a, preferably negative, heat conduction occurs from the second temperature section 12 via the bridge element 15 to the first temperature section 11. Thus, the temperature difference 200 at the first temperature section 11 can be tapped by the conversion element 14. Furthermore, the conversion element 14 can be arranged on the bridge element as shown in FIG. 5, so that a, in particular negative and/or positive, heat conduction occurs from the first and second temperature section 11, 12 respectively to the bridge element and the temperature difference 200 is tapped by the conversion element 14 at the bridge element 15.

FIG. 6 shows a kitchen utensil 5 according to the invention with a supply unit 10 for generating electric energy and a functional element 6, which form a structural unit. In particular, the kitchen utensil 5 is a meat thermometer. Thereby, the supply unit 10 comprises a first temperature section 11, in which the functional element 6 is integrated. The first temperature section 11 comprises a needle-like shape for being pierced, together with the functional element 6, into a food product to detect its internal temperature. A first temperature region 201 may be present within the food product. For this purpose, the functional element 6 comprises a sensor 6.1 in the form of a temperature sensor. The supply unit 10 further comprises a providing means 13 for providing an electric function to the kitchen utensil 5. For this purpose, the providing means 13 comprises a conversion element 14 in the form of an electro-thermal converter. Furthermore, the supply unit 10 comprises a second temperature section 12, which can be arranged in a second temperature region 202, in which a temperature difference 200 with respect to the first temperature region 201 is present. The conversion element 14 is thereby arranged relative to the first and second temperature section 11, 12, in particular between the first and second temperature section 11, 12, such that the conversion element 14 is exposed to the temperature difference 200. A bridge element 15 in the form of a thermally conductive section of the kitchen utensil 5 may be arranged between the first and second temperature section 11, 12. Depending on the temperature difference 200, thermal energy can be converted into electric energy by the conversion element 14. Furthermore, a connection means 16 in the form of an electric line is provided from the conversion element 14 to the functional element 6. This allows the electric energy to be provided to the functional element 6. In addition or alternatively, the electric energy of the conversion element 14 can be used, for example, to energize an, in particular digital, display 5.1 of the kitchen utensil 5 for indicating the temperature to a user.

The foregoing explanation of the embodiments describes the present invention exclusively in the context of examples. Of course, individual features of the embodiments can be freely combined with each other, provided that this is technically reasonable, without leaving the scope of the present invention.

LIST OF REFERENCE SIGNS 1 kitchen system
2 kitchen apparatus
3 interior
3.1 door region
4 exterior
5 kitchen utensil
5.1 display
6 functional element
6.1 sensor
6.2 electric conductor
6.3 internal communication module from 6
7 end device
10 supply unit
11 first temperature section
12 second temperature section
13 providing means
14 conversion element
15 bridge element
15.1 insulation layer
15.2 fixing section
15.3 signal bridge
16 connection means
16.1 ladder
17 energy source
17.1 switching element
18 electronic unit
18.1 printed circuit board
18.2 evaluation module
18.3 external communication module
18.4 internal communication module
200 temperature difference
201 first temperature region
202 second temperature region
T temperature

The invention claimed is:

1. A supply unit for generating electric energy for an electric function during an operation of a functional element of a kitchen utensil when arranged in a first temperature region, comprising
a first temperature section for an arrangement in the first temperature region,
a second temperature section for an arrangement in a second temperature region comprising a temperature difference with respect to the first temperature region, and
a providing means for providing electric energy for the function during operation of the functional element with a conversion element for converting a thermal energy into electric energy depending on the temperature difference,
wherein the first and second temperature sections are connected by a thermally conductive bridge element, wherein the supply unit is fastened to a kitchen appliance by the bridge element, wherein the bridge element and the first and second temperature sections form a fastening section for fastening the supply unit in an opening region of the kitchen appliance, so that the first temperature section is arranged in an inner space of the kitchen appliance and the second temperature section is arranged in an external space.

2. The supply unit according to claim 1, wherein the conversion element comprises an electro-thermal converter.

3. The supply unit according to claim 1, wherein the conversion element is arranged at the first temperature section, at least at the second temperature section or at the bridge element.

4. The supply unit according to claim 1, wherein the providing means comprises an additional energy source for providing electric energy.

5. The supply unit according to claim 1, wherein an electronic unit is provided for at least data or signal processing for the function of the kitchen utensil.

6. The supply unit according to claim 5, wherein the electronic unit comprises an evaluation module for evaluating measurement signals of the kitchen utensil.

7. The supply unit according to claim 5, wherein the providing means comprises a connection means for a connection at least for current transmission to the functional element or for data communication with the functional element.

8. The supply unit according to claim 7, wherein at least the connection means comprises an internal communication module for a wireless data communication with the functional element of the kitchen utensil or the electronic unit comprises an external communication module for a wireless data communication with an end device.

9. The supply unit according to claim 1, wherein the bridge element comprises a signal bridge for forwarding electric signals between the first and second temperature region.

10. The supply unit according to claim 1, wherein the fastening section is U-shaped.

11. The supply unit according to claim 1, wherein the opening region is in a form of a door region of the kitchen appliance.

12. A kitchen utensil comprising
a functional element for an arrangement in a first temperature region, and
a supply unit for generating electric energy for an electric function during an operation of the functional element with a first temperature section for an arrangement in the first temperature region,
a second temperature section for an arrangement in a second temperature region, which comprises a temperature difference with respect to the first temperature region, and
a providing means for providing electric energy for the function during operation of the functional element with a conversion element for converting thermal energy into electric energy depending on the temperature difference,
wherein the first and second temperature sections are connected by a thermally conductive bridge element, wherein the supply unit is fastened to a kitchen appliance by the bridge element, wherein the bridge element and the first and second temperature sections form a fastening section for fastening the supply unit in an opening region of the kitchen appliance, so that the first temperature section is arranged in an inner space of the kitchen appliance and the second temperature section is arranged in an external space.

13. The kitchen utensil according to claim 12, wherein the functional element comprises a sensor for sensing process data during the use of at least the kitchen utensil or a kitchen apparatus.

14. The kitchen utensil according to claim 12, wherein the functional element and a connection means of the supply unit each comprise an internal communication module for a connection of the functional element to the supply unit or the connection means comprises an electric conductor for connecting the functional element to the supply unit.

15. A kitchen system comprising;
a kitchen apparatus with an interior which comprises a temperature difference with respect to an exterior, and
a kitchen utensil according to claim 12, which is arranged partially in the interior and partially in the exterior.

* * * * *